(12) United States Patent
Li et al.

(10) Patent No.: US 7,751,491 B2
(45) Date of Patent: Jul. 6, 2010

(54) CODE DESIGN METHOD FOR REPEAT-ZIGZAG HADAMARD CODES

(75) Inventors: Kai Li, New York, NY (US); Guosen Yue, Plainsboro, NJ (US); Xiaodong Wang, New York, NY (US); Mohammad Madihian, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 621 days.

(21) Appl. No.: 11/768,591

(22) Filed: Jun. 26, 2007

(65) Prior Publication Data

US 2008/0008270 A1    Jan. 10, 2008

Related U.S. Application Data

(60) Provisional application No. 60/806,152, filed on Jun. 29, 2006, provisional application No. 60/806,149, filed on Jun. 29, 2006.

(51) Int. Cl.
*H04L 5/12* (2006.01)

(52) U.S. Cl. .................. 375/262; 375/240; 375/341; 714/794; 714/795

(58) Field of Classification Search .................. 375/240, 375/254, 285, 340, 346, 262, 341; 714/759, 714/774, 786, 790, 794, 795
See application file for complete search history.

(56) References Cited

U.S. PATENT DOCUMENTS 6,222,946 B1 *   4/2001   Abe ........................... 382/281
6,925,107 B2 *   8/2005   Hagenauer et al. .......... 375/147

* cited by examiner

*Primary Examiner*—Dac V Ha
(74) *Attorney, Agent, or Firm*—Joseph Kolodka

(57) ABSTRACT

A method for selecting a signal to noise ratio for a communications code includes obtaining extrinsic information transfer (EXIT) information for a repeat-zigzag Hadamard (RZH) code responsive to a Hadamard order and a signal to noise ratio, determining code parameters for an irregular repeat zigzag Hadamard (IRZH) code for a corresponding code rate in response to the obtained EXIT values, and repeating the step of obtaining the EXIT information for a different signal to noise ratio if the corresponding code rate is other than a selected rate. The corresponding code rate is related to a bit error rate. In a preferred embodiment, the step of obtaining EXIT information includes one of obtaining an EXIT curve for repeat-zigzag Hadamard code by Monte Carlo simulation using serial decoding or obtaining an EXIT function for parallel decoding of the repeat-zigzag Hadamard code by using equations.

17 Claims, 7 Drawing Sheets

CODE DESIGN METHOD FOR REPEAT-ZIGZAG HADAMARD CODES

This application claims the benefit of U.S. Provisional Application No. 60/806,152, entitled "Code Design Methods for Repeat-Zigzag Hadamard Codes", filed on Jun. 29, 2006, and U.S. Provisional Application No. 60/806,149, entitled "Low-Complexity High-performance Low-Rate-Code", filed on Jun. 29, 2006, the contents of both which are incorporated by reference herein.

BACKGROUND OF THE INVENTION

The present invention relates generally to coding techniques for communications and, more particularly, to code designing for repeat-zigzag Hadamard codes.

For communication systems operating in the low signal-to-noise ratio (SNR) regime (e.g., code-spread communication systems and power-limited sensor networks), low-rate coding schemes play a critical role. Traditional low-rate channel coding schemes include Hadamard codes and super-orthogonal convolutional codes. These codes offer low coding gain and hence their performance is far away from the ultimate Shannon limit. The ultimate Shannon capacity of an Additive White Gaussian Noise (AWGN) channel in terms of SNR per information bit is about −1.6 dB for codes with rates approaching zero. Turbo-code-based, low-rate concatenated coding schemes have been proposed which offer higher performance but they also incur higher complexities due to the complex trellis structures that specify the codes. The low-density parity-check (LDPC) codes and the repeat-accumulate (RA) codes offer capacity-approaching capability for various code rates when the ensemble profiles are optimized. However, in the low-rate region, they both suffer from significant performance loss and extremely slow convergence with iterative decoding. On the other hand, Hadamard codes have been shown to be a useful tool for improving the code performance in the low-rate region. Constructed from Hadamard code arrays, low-rate turbo-Hadamard codes offer a bit-error-rate (BER) of $10^{-5}$ at a signal to noise ratio $E_b/N_0 = -1.2$ dB, which is only around 0.4 dB away from the Shannon limit. More recently, built on zigzag codes, parallel-concatenated zigzag-Hadamard (PCZH) codes and repeat-zigzag-Hadamard (RZH) codes have been proposed, both of which exhibit much simpler encoder and decoder structures while still offering a similar performance as that of the turbo-Hadamard codes.

Similar to LDPC codes and RA codes, an RZH code can be represented by its Tanner graph, based on which iterative decoding algorithms can be derived. In two decoding schemes, namely the turbo-like serial decoding and the LDPC-like parallel decoding, it is clear that the parameters of an RZH code need to be chosen carefully for capacity-approaching performance, which leads to the irregular RZH (IRZH) code with optimized degree profile. The exact density evolution method for LDPC code design can be employed for the IRZH code optimization. However, the complexity is extremely high, even for the moderate rate LDPC codes. Density evolution with Gaussian approximation does not work for the design of low-rate RZH codes. Accordingly, there is a need for a design method for low-rate RZH codes.

SUMMARY OF THE INVENTION

In accordance with the invention, there is provided a method to, with a given rate, design the irregular RZH code with minimum signal-to-noise ratio threshold or given a signal-to-noise ratio threshold, design a code ensemble to a maximizing rate. The signal-to-noise ratio threshold means that for any signal-to-noise ratio greater than this threshold, the BER of the code will go to zero or a very small value when the code length is enough long.

In accordance with an aspect of the invention, a method for selecting a signal to noise ratio for a communications code includes obtaining extrinsic information transfer (EXIT) information for a repeat-zigzag Hadamard (RZH) code responsive to a Hadamard order and a signal to noise ratio, determining code parameters for an irregular repeat zigzag Hadamard (IRZH) code for a corresponding code rate in response to the obtained EXIT values, and repeating the step of obtaining the EXIT information for a different signal to noise ratio if the corresponding code rate is other than a selected rate. In a preferred embodiment, the step of obtaining EXIT information includes one of obtaining an EXIT curve for repeat-zigzag Hadamard code by Monte Carlo simulation using serial decoding or obtaining an EXIT function for parallel decoding of the repeat-zigzag Hadamard code by using equations.

In yet another aspect of the invention, a method for selecting a signal to noise ratio for a communications code includes choosing a signal to noise ratio, selecting a Hadamard code order, obtaining extrinsic information transfer (EXIT) information for one of a serial decoding and a parallel decoding of a irregular repeat-zigzag Hadamard (IRZH) code responsive to the Hadamard order and the signal to noise ratio, determining a code ensemble for the irregular repeat zigzag Hadamard (IRZH) code for a related bit error rate in response to the obtained EXIT information, and changing the signal to noise ratio for repeated steps of obtaining the EXIT information and determining a code ensemble for a different signal to noise ratio if the related bit error rate is other than a target rate. Preferably, the EXIT information is a curve for the irregular repeat-zigzag Hadamard (IRZH) code obtained by Monte Carlo simulation using the serial decoding and the EXIT information is a function for parallel decoding the irregular repeat-zigzag Hadamard (IRZH) code using equations.

BRIEF DESCRIPTION OF DRAWINGS

These and other advantages of the invention will be apparent to those of ordinary skill in the art by reference to the following detailed description and the accompanying drawings.

DETAILED DESCRIPTION

The inventive code design considers two decoding schemes, namely the turbo-like serial decoding and the LDPC-like parallel decoding. Parameters of an RZH code need to be chosen carefully for capacity-approaching performance, which leads to the irregular RZH (IRZH) code with optimized degree profile. The invention considers the design methods for IRZH codes. For turbo-like decoding, the extrinsic information transfer function (EXIT) chart technique can be employed to optimize the code profiles. EXIT functions characterize mutual information between the input and output of constituent decoders significantly facilitates performance analysis of iterative coding schemes. The design method for both decoding schemes is based on EXIT function/EXIT chart. One may always get the EXIT by Monte Carlo simulation for both decoding schemes. For parallel decoding, one obtains the EXIT function analytically, i.e., a mathematical formulation. With that one can calculate the EXIT value without using the simulation, which simplifies or reduces the complexity of the code design procedure significantly. Since in this case the inner decoder is a trellis-based zigzag-Hadamard (ZH) decoder, an analytical expression of its EXIT function is not available, and the inventive code design resorts to Monte Carlo simulations to obtain the EXIT functions of the inner code. For LDPC-like parallel decoding, the connection bits of the ZH code are treated as degree-2 variable nodes, and the inner constituent decoder becomes a Hadamard decoder, having the channel observations of the parity bits and the a priori probabilities about the information or connection bits as the input, and the extrinsic information for the information/connection bits as the output. EXIT functions with multiple inputs and outputs are difficult to obtain using Monte Carlo simulations. EXIT functions of Hadamard with multiple inputs and outputs in the context of low-rate RZH codes over BIAWGN channels are derived and applied to the analysis and design of RZH codes. With the EXIT functions, bit error rates (BERs) for a given communication code profile can be estimated and the differential evolution (DE) method can be employed to optimize the degree profile.

Figure 1:
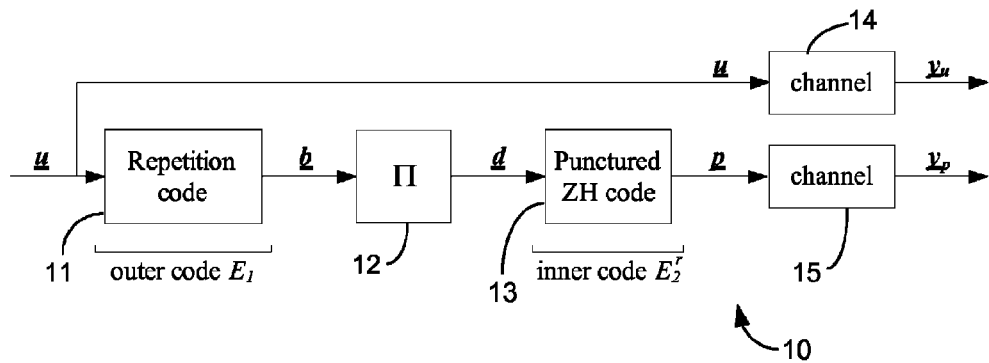
FIG. 1 is a block diagram of a systematical repeat-zig-zag-Hadamard RZH encoder.

The structure of a systematic, repeat-zigzag-Hadamard RZH code is shown by the diagram 10 in FIG. 1. The RZH code is an alternative code structure to parallel concatenated ZH codes and turbo-Hadamard codes. An information bit block $\underline{u}$ of length k is fed out directly on a channel 14 and also encoded by an outer repetition encoder $E_1$ 11 of rate $1/d_v$ into a codeword $\underline{b}$ of length $N=kd_v$, which is permuted by an interleaver $\Pi$, 12 of length N to form $\underline{d}$, then encoded by an inner systematic recursive ZH encoder $E_2$, 13 and out on channel 15. Since the outer code is a repetition code and the inner ZH code is a systematic code, there are $d_v$ repetitions in the resulting ZH codeword for every information bit. Since a repetition code has no coding gain, it is desirable to transmit the information bits only once. Also notice that the common bit of a ZH segment is the same as the last parity bit of the previous Hadamard segment and hence introduces a degree-2 repetition code. As a consequence, one can puncture the last parity bit and only transmit the common bit. After puncturing, the inner code is a punctured ZH code with which one can obtain the systematic RZH code as shown in FIG. 1, with the parity bits $\underline{p}$ being the output of the punctured ZH code. Let n be the length of the ultimate codeword $\underline{c}=\{\underline{u}, \underline{p}\}$, then the overall code is an (n,k) linear block code and the overall coding rate is given by $$R_c = \frac{r}{d_v(2^r - r - 1) + r}, \quad (1)$$

where r is the order of the Hadamard code for the inner encoder.

Figure 2:
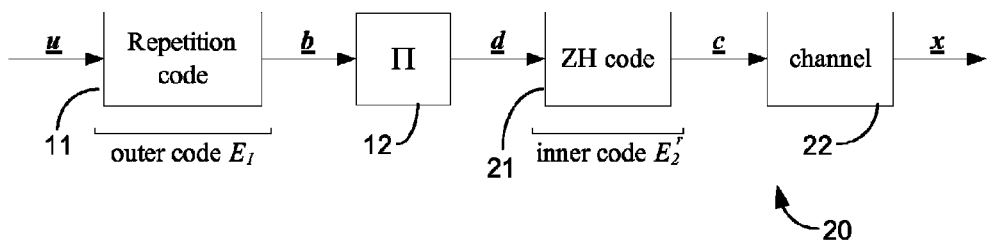
FIG. 2 is a block diagram unpunctured, zig-zag-Hadamard RZH encoder.

In case that the inner code has no puncturing, one can have the un-punctured RZH codes output on a single channel 22 whose structure 20 is shown in FIG. 2. For the un-punctured code, the overall code rate is given by $R_c=R_1R_2$, where $R_1=1/d_v$ is the rate of the outer repetition code and $R_2$ is the rate of the inner ZH code 21. Since normally the first common bit of the ZH code is omitted, the overall rate of the un-punctured RZH code is given by $$R_c = \frac{k}{\left(\frac{kd_v}{r}\right)2^r - 1} = \frac{r}{d_v 2^r - r/k}. \quad (2)$$

With $k \to \infty$, then $$R_c \to \frac{r}{d_v 2^r}.$$

When the coding rate is very low, e.g., $R_c \leq 0.01$, the performance difference between the punctured one and the un-punctured code is relatively small; whereas in the range around $R_c=0.05$, the punctured code offers a significant coding gain over the un-punctured one due to the elimination of the repetition bits embedded in the inner ZH codes.

Figure 3:
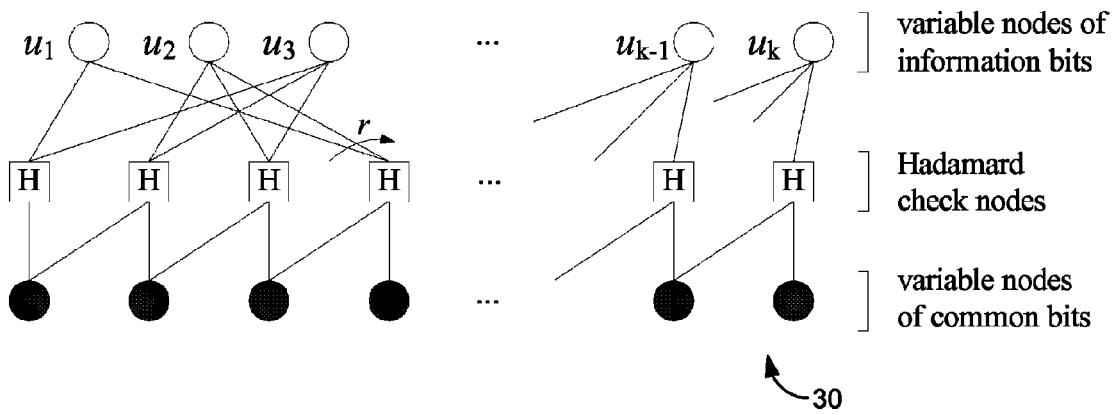
FIG. 3 is a tanner graph of an unpunctured (n,k) RZH code.

A RZH code can be represented by its Tanner graph 30, as shown in FIG. 3, there are three sets of nodes in the Tanner graph of a RZH code: the variable nodes of information bits, corresponding to u, the variable nodes of common bits, corresponding to q, and the Hadamard check nodes, corresponding to the Hadamard code constraints. Note that in FIG. 3, the parity bits of Hadamard code words are embedded in their Hadamard check nodes. Those information bits that are repeated $d_v$ times are represented by information bit variable nodes with degree $d_v$, since they participate in $d_v$ Hadamard code constraints, and the common bit variable notes can be viewed as degree-2 information bit variable nodes. Each Hadamard check node is connected to r information bit nodes and to two common bit nodes. The connections between Hadamard check nodes and information bit nodes are determined by the edge interleaver and are highly randomized, whereas the connections between Hadamard check nodes and common bit nodes are arranged in a highly-structured zigzag pattern.

Figure 4:
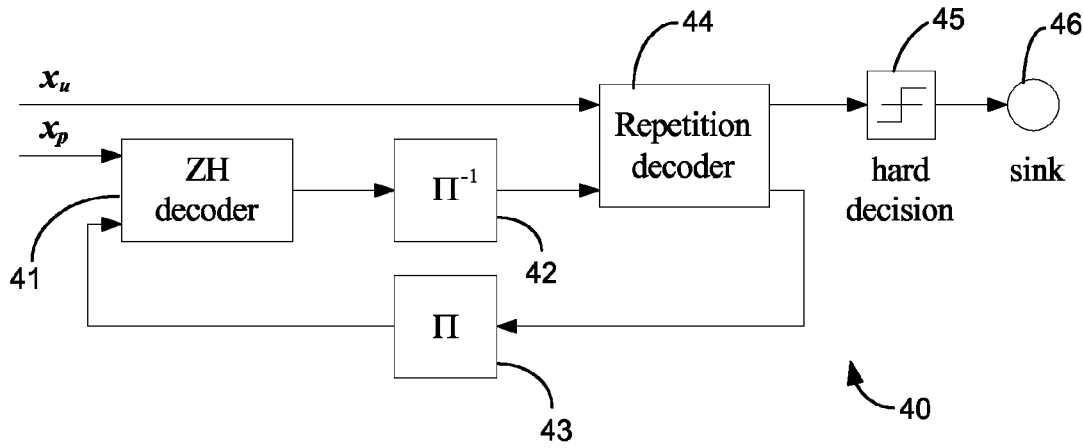
FIG. 4 is a block diagram of turbo-like decoding of systematic RZH codes.
Figure 5:
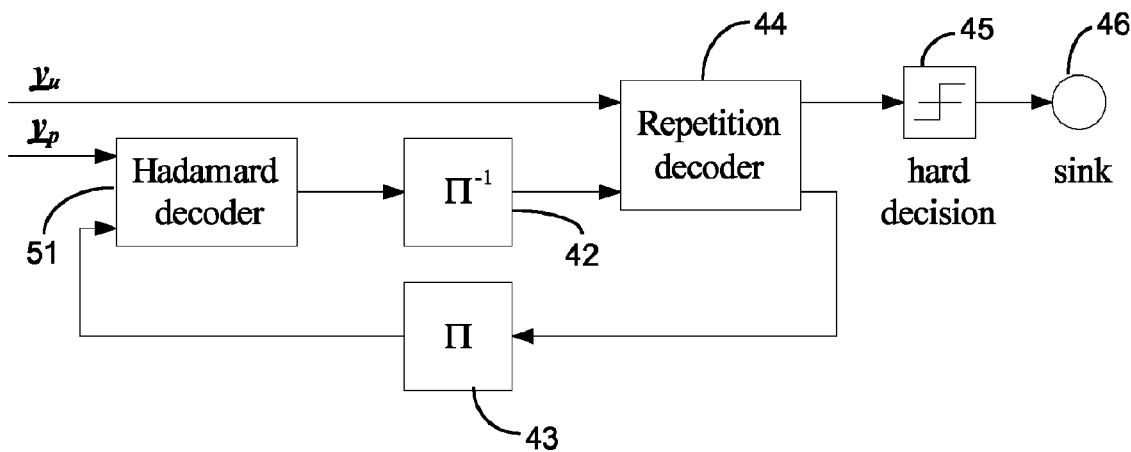
FIG. 5 is a block diagram of parallel decoding of systematic RZH codes.

Based on the Tanner graph, iterative decoding algorithms can be derived. Two belief-propagation (BP) based decoding schemes for RZH codes can be employed. The turbo-like serial decoding 40 depicted in FIG. 4 and the LDPC-like parallel decoding 50 depicted in FIG. 5. Both decoding schemes entail outer repetition decoders 44 and inner serial decoder 41, 51 or a Hadamard decoder 51 with interleavers $\Pi^{-1}$ 42 and $\Pi$ 43. Output from the repetition decoders is sent to a decision block 45, tied to the sink output 46. In general, the serial decoding takes less iteration number than the parallel one, whereas the latter enjoys the advantage of easy hardware implementation with parallel processing. There is no fundamental difference in terms of bit error rate (BER) performance.

Design Methods for Turbo-Like Decoding

The code design of IRZH codes with serial decoding where the outer code is a mixture of repetition codes with different rates is considered. The design approach closely follows those described for RA codes and LDPC codes where the EXIT chart technique is utilized as a design tool. EXIT functions of the component codes and code ensemble optimization are examined.

EXIT Functions of the Component Codes

Considering EXIT functions of the component codes, for an (n,k) IRZH codes, the outer code consists of k repetition codes with variable rates. As shown in FIG. 3, suppose the rate of the ith repetition code is $1/d_v^{(i)}$, the degree of the ith variable node of information bit is $d_v^{(i)}$. For the outer repetition codes, the EXIT curve is obtained in a similar manner as for RA codes and LDPC codes. Specifically, consider first un-punctured RZH codes. As discussed in Section 3, an information bit variable node of degree $d_v$ has $d_v$ incoming messages from the edge interleaver, and the decoder outputs are given by $$L_{rep}^{out}(i) = L_{ch} + \sum_{j \neq i} L_{rep}^{in}(j), \quad (3)$$

where $L_{ch}$ is the LLR value about the information bit from the channel. For AWGN channel with noise variance $$\sigma^2 = \frac{N_0}{2},$$

then $$L_{ch} = \frac{2x_u}{\sigma^2}$$

where $x_u$ is the channel observation of the binary phase shift keying (BPSK) modulated information bit u. $L_{rep}^{in}(j)$ is modeled as the output LLR of an AWGN channel whose input is the jth interleaver bit transmitted using BPSK. The EXIT function of a degree-$d_v$ variable node is then $$I_{E,VND}(I_{A,VND}, d_v) = J(\sqrt{(d_v-1)}J^{-1}(I_{A,VND})) \quad (4)$$

where $$J(\sigma) \overset{\Delta}{=} 1 - \frac{1}{\sqrt{2\pi\sigma^2}} \int_{-\infty}^{\infty} e^{-\frac{(\zeta-\sigma^2/2)^2}{2\sigma^2}} \log_2[1+e^{-\zeta}]d\zeta.$$

Since $J(\sigma)$ is a monotonically increasing function of $\sigma$, it is invertible.

Given the Hadamard code order r, the IRZH design involves specifying the variable node degrees $d_v^{(i)}$, i=1, 2, ..., k. Let D be the number of different variable node degrees, and denote these degrees by $d_{v,i}$, i=1, 2, ..., D. Then the degree profile of a code can be specified by a polynomial $$f(x) = \sum_{i=1}^{D} a_i x^{d_{v,i}}$$

where $a_i \geq 0$ is the fraction of nodes having degree $d_{v,i}$. Note that $\{a_i\}$ must satisfy $$\sum_i a_i = 1.$$

The average variable node degree is then given by $$\bar{d}_v = \sum_{i=1}^{D} a_i \cdot d_{v,i}. \quad (5)$$

Since for $$k \to \infty, R_c = \frac{r}{\bar{d}_v 2^r}, \quad \text{then}$$

then $$\bar{d}_v = \frac{r}{R_c 2^r}. \quad (6)$$

Let $b_i$ be the fraction of edges incident to variable nodes of degree $d_{v,i}$. There are $(ka_i)d_{v,i}$ edges involved with such nodes, so then $$b_i = \frac{ka_i d_{v,i}}{k\bar{d}_v} = \frac{d_{v,i}}{\bar{d}_v} \cdot a_i. \quad (7)$$

Note that $\{b_i\}$ must satisfy $$\sum_i b_i = 1.$$

It has been shown that the EXIT function of a mixture of codes is an average of the component EXIT functions. With (4), (6) and (7), the effective transfer function of the outer mixture codes is thus given by $$I_{E,VND} = g(I_{A,VND}, R_c, r) \quad (8)$$

$$= \sum_{i=1}^{D} b_i \cdot I_{E,VND}(I_{A,VND}, d_{v,i}) \quad (9)$$

$$= \frac{R_c 2^r}{r} \sum_{i=1}^{D} d_{v,i} \cdot a_i \cdot I_{E,VND}(I_{A,VND}, d_{v,i}). \quad (10)$$

Since $g(\cdot)$ is a monotonically increasing function of $I_{A,VND}$, it is invertible and then $I_{A,VND} = g^{-1}(I_{E,VND}, R_c, r)$.

For systematic RZH codes, an information bit variable node of degree $d_v$ has $d_v+1$ incoming messages: $d_v$ from the edge interleaver and one from the channel. The decoder outputs are given by (3). Then the EXIT function of a degree-$d_v$ variable node is given by $$I_{E,VND}\left(I_{A,VND}, d_v, \frac{E_s}{N_0}\right) = J\left(\sqrt{(d_v - 1)[J^{-1}(I_{A,VND})]^2 + \sigma_{ch}^2}\right) \quad (11)$$

where $$\sigma_{ch}^2 = \frac{4}{\sigma^2} = 8 \cdot \frac{E_s}{N_0}, \text{ with } \frac{E_s}{N_0} = R_c \cdot \frac{E_b}{N_0}$$

being the symbol SNR. For systematic RZH codes, then $$R_c = \frac{r}{\bar{d}_v(2^r - r - 1) + r},$$

hence $$\bar{d}_v = \frac{r}{2^r - r - 1}\left(\frac{1}{R_c} - 1\right). \quad (12)$$

Then with (7), (11) and (12), one can have the effective transfer function of the outer mixture codes as follows $$I_{E,VND} = g\left(I_{A,VND}, \frac{E_s}{N_0}, R_c, r\right) \quad (13)$$

$$= \sum_{i=1}^{D} b_i \cdot I_{E,VND}\left(I_{A,VND}, d_{v,i}, \frac{E_s}{N_0}\right) \quad (14)$$

$$= \frac{2^r - r - 1}{r} \cdot \frac{R_c}{1 - R_c} \sum_{i=1}^{D} d_{v,i} \cdot a_i \cdot I_{E,VND}\left(I_{A,VND}, d_{v,i}, \frac{E_s}{N_0}\right). \quad (15)$$

Again, $g(\cdot)$ is invertible, and one can have $$I_{A,VND} = g^{-1}\left(I_{E,VND}, \frac{E_s}{N_0}, R_c, r\right).$$

In order to perform code ensemble optimization, the EXIT transfer function of the inner ZH decoder is needed. In general, there is no closed-form formula, hence the EXIT function is computed by simulation and denoted it by $$I_{E,ZH} = h\left(I_{A,ZH} \cdot \frac{E_s}{N_0}, r\right). \quad (16)$$

Code Ensemble Optimization

In the case of code ensemble optimization, for given r and $$\frac{E_s}{N_0},$$

the optimal IRZH ensemble parameters $\{a_i\}$ that maximize $R_c$ subject to vanishing BER $$P_b\left(\frac{E_s}{N_0}\right),$$

are solution of the following optimization problem $$\max R_c \text{ s.t. } \sum_i a_i = 1, a_i \geq 0, \forall i \text{ and } P_b\left(\frac{E_s}{N_0}\right) = 0. \quad (17)$$

EXIT charts can be used to analyze the convergence properties of RA codes and LDPC codes. The same principle can be applied to RZH codes. Specifically, if there is an open tunnel between the EXIT functions of the inner code and outer code for given r and $$\frac{E_s}{N_0},$$

the iterative decoding algorithm can asymptotically converge and then $$P_b\left(\frac{E_s}{N_0}\right) = 0$$

with a sufficient large number of iteration. Mathematically, the convergence condition is given by $$h\left(I_{A,ZH}, \frac{E_s}{N_0}, r\right) > g^{-1}(I_{A,ZH}, R_c, r), \text{ for } I_{A,ZH} \in [0, 1), \quad (18)$$

for un-punctured RZH codes, and $$h\left(I_{A,ZH}, \frac{E_s}{N_0}, r\right) > g^{-1}\left(I_{A,ZH}, \frac{E_s}{N_0}, R_c, r\right), \text{ for } I_{A,ZH} \in [0, 1), \quad (19)$$

for systematic codes. With the help of the EXIT chart analysis, one can simplify the above optimization problem by replacing the constraint $$P_b\left(\frac{E_s}{N_0}\right) = 0$$

in (17) with condition (18) or (19). To design an IRZH code for a particular rate $R_c$, we simply choose proper Hadamard degree and change $$\frac{E_s}{N_0}$$

in (17) until the resulting optimization result $R_c^* = R_c$.

Design Method for LDPC-Like Decoding

The design approach for IRZH codes with parallel decoding closely follows that for irregular LDPC codes using the deferential evolution (DE) technique. During the optimization, the BER for a given code profile has to be estimated, which can be done through mutual information evolution. The mutual information transfer function for the outer repetition code is similar to the case for serial decoding. Hence, obtaining the EXIT functions for Hadamard codes is needed.

EXIT Functions Hadamard Components

The EXIT functions for Hadamard codes with multiple inputs on BIAWGN channels are considered. Since it is difficult to directly compute the EXIT functions of the output from the MAP decoder, use is made of a pMAP decoder to derive an approximation for the extrinsic mutual information over binary-input additive white Gaussian noise BIAWGN channels. Basic properties of BIAWGN channel are introduced and the pMAP decoder, with which an approximate expression for the EXIT function over BIAWGN for general linear block codes and Hadamard codes is derived.

Properties of BIAWGN Channels

First the BIAWGN channel, its LLR and "soft bit" outputs are characterized. A BIAWGN channel is characterized by its variance $\sigma^2$. Let Y denote the BIAWGN channel observation for a transmitted BPSK modulated bit X, and let $$L \stackrel{\Delta}{=} \log \frac{Pr(X = +1 \mid Y)}{Pr(X = -1 \mid Y)},$$

$$T \stackrel{\Delta}{=} Pr(X = +1 \mid Y) - Pr(X = -1 \mid Y)$$

denote the LLR and "soft bit" estimation of X based on the channel observation Y respectively. For a BIAWGN channel one can have $$L = \frac{2Y}{\sigma^2} \text{ and } T = \tanh\left(\frac{L}{2}\right).$$

Suppose that +1 is transmitted, then $(L|X=+1) \sim N(m, 2m)$, where $$m = \frac{2}{\sigma^2}.$$

Hence $(T|X=+1)$ has the following pdf $$f_{T|X=+1}(t) = \frac{2}{1-t^2} f_L\left(\ln\frac{1+t}{1-t}\right), \quad (20)$$

where $f_L$ denotes the pdf of $(L|X=+1)$. With (20), the (2i)-th moment of $(T|X=+1)$ as a function of m is given by $$\Phi_i(m) \stackrel{\Delta}{=} E\{T^{2i} \mid X = +1\} \quad (21)$$

$$= \int_{-1}^{+1} \frac{2t^{2i}}{(1-t^2)\sqrt{4\pi m}} \exp\left(-\frac{\left(\ln\frac{1+t}{1-t} - m\right)^2}{4m}\right) dt.$$

The mutual information between X and L as a function of m is given by [?]

$$W(m) \stackrel{\Delta}{=} I(X; L) \quad (22)$$

$$\int_R \frac{1}{\sqrt{4\pi m}} \exp\left(-\frac{(\ell - m)^2}{4m}\right)(1 - \log_2(1 + e^{-\ell})) d\ell,$$

which is invertible and hence has $m = W^{-1}(I)$.

MAP and pMAP Decoders

Now, turning to the output of the MAP decoder and the pMAP decoder. Given an (n,k) linear block code C over GF(2), the dual code $C^\perp$ is an (n,n−k) linear block code. Let $\underline{c}_j^\perp = [c_{j,1}^\perp, c_{j,2}^\perp, \ldots, c_{j,n}^\perp]^T$ denote the j-th codeword of the (n,n−k) dual code. Denote by $I_{i,1}^\perp = \{j | c_{j,i}^\perp = 1\}$ the set of indices of all codewords in the dual code with the i-th bit being 1 (or the set of indices of all parity-checks that the i-th bit participates in), and $I_{i,0}^\perp = \{j | c_{j,i}^\perp = 0\}$ the set of indices of all codewords in the dual code with the i-th bit being 0.

The extrinsic MAP decoding can be implemented by using the dual code as follows $$T_{EMAP,i} \stackrel{\Delta}{=} Pr(X_i = 1 \mid \underline{Y}_{[i]}) - Pr(X_i = -1 \mid \underline{Y}_{[i]}) \quad (23)$$

$$= \frac{\sum_{j \in I_{i,1}^\perp} \prod_{\ell=1, \ell \neq i}^n T_\ell^{c_{j,\ell}^\perp}}{\sum_{j \in I_{i,0}^\perp} \prod_{\ell=1, \ell \neq j}^n T_\ell^{c_{j,\ell}^\perp}}.$$

Let $D_{EMAP,i}$ be the extrinsic output of MAP decoder (23) after the following modification $$D_{EMAP,i} \stackrel{\Delta}{=} 1 + T_{EMAP,i} \quad (24)$$

$$= 2Pr(X_i = 1 \mid \underline{Y}_{[i]})$$

-continued $$= 1 + \frac{\sum_{j \in I_{i,1}^\pm} \prod_{\ell=1,\ell \neq j}^n T_\ell^{c_{j,\ell}^\pm}}{\sum_{j \in I_{j,0}^\pm} \prod_{\ell=1,\ell \neq i}^n T_\ell^{c_{j,\ell}^\pm}}.$$

The extrinsic output of a suboptimal decoder which one can call pMAP decoder [?] is defined as $$D_{EpMAP,i} \overset{0}{=} \prod_{S \in P(I_{i,1}^\pm) \backslash \phi} \left(1 + \prod_{\ell=1,\ell \neq i}^n T_\ell^{\vee_{j \in S}(c_{j,\ell}^\pm)}\right)^{(-1)^{|S|+1}}, \quad (25)$$

where $P(I_{i,1}^\perp)$ denotes the set of all subsets of $I_{i,1}^\perp$ and "$\vee$" denotes logical "or" operation. In what follows, the pMAP decoder is employed to obtain an approximate expression for the EXIT functions of linear block codes over a BIAWGN channel. Since the basic idea is to decompose the EXIT function in the form of a series EXIT functions of multiple single parity-check codes, we will start from the EXIT function of single parity-check codes.

EXIT Functions for General Linear Block Codes

Note that the goal is to find the extrinsic functions for different bits given that the a priori mutual information from the extrinsic and the communication channels for different bits is different. Keeping this in mind, we first compute the extrinsic information at the output of a single parity-check code.

Theorem 4.1.

The extrinsic information of the i-th bit at the output of MAP decoder of an (n,n−1) single parity-check code is given by:

$$I_{E,i} = I(X_i; T_{EMAP,i}) = \frac{1}{\ln 2} \sum_{j=1}^\infty \frac{1}{(2j)(2j-1)} \left(\prod_{\ell=1,\ell \neq i}^n E\{T_\ell^{2j}\}\right). \quad (26)$$

Proof:

The dual code of the (n,n−1) single parity-check code is the repetition code of length n. Hence from (23) it follows that $$T_{EMAP,i} = \prod_{\ell=1,\ell \neq i}^n T_\ell, \quad (27)$$

then using a known proposition 2.6, the extrinsic mutual information of the i-th bit at the output of MAP decoder is given by $$I(X_i; T_{EMAP,i}) = E_{T_{EMAP,i}|c_0}\{\log_2(1 + T_{EMAP,i})\}$$

$$= E_{T_{EMAP,i}|c_0}\left\{\log_2\left(1 + \prod_{\ell=1,\ell \neq i}^n T_\ell\right)\right\}$$

$$= \frac{1}{\ln 2} \sum_{j=1}^\infty \frac{1}{(2j)(2j-1)} E\left\{\prod_{\ell=1,\ell \neq i}^n T_\ell^{2j}\right\}$$

$$= \frac{1}{\ln 2} \sum_{j=1}^\infty \frac{1}{(2j)(2j-1)} \left(\prod_{\ell=1,\ell \neq i}^n E\{T_\ell^{2j}\}\right),$$

where the last equality holds since the channel is assumed to be memoryless.

For the single parity-check codes, pMAP and MAP decoders are identical in any memoryless channel, and the Conjecture 4.1 also states that for other high rate codes, $D_{EMAP} \cong D_{EpMAP}$ when the all-zero codeword is transmitted over the BIAWGN channel. We have the following result.

Theorem 4.2.

Let C be an (n,k) linear block code such that in BIAWGN channel $D_{EMAP} = D_{EpMAP}$. Then the mutual information between $X_i$ and $T_{EMAP,i}$ is given by $$I_{E,i}^{BIAWGN} = \frac{1}{\ln 2} \sum_{S \in P(I_{i,1}^\pm) \backslash \phi} (-1)^{|S|+1} \sum_{j=1}^\infty \frac{1}{(2j)(2j-1)} \left(\prod_{\ell \in V(S), \ell \neq i} \Phi_j(m_\ell)\right), \quad (28)$$

where $V(S) = \{\ell \in \{1, \ldots, n\} | \vee_{j \in S} c_{j,\ell}^\perp = 1\}$, and $m_\ell = W^{-1}(I_{A,\ell})$ where $I_{A,\ell}$ is the a priori mutual information about $X_\ell$ from the channel given $X_\ell = +1$ is transmitted.

Proof:

According to a known Theorem and (24), we have $$I_{E_i}^{BIAWGN} = I(X_i; T_{EMAP,i})$$

$$= E_{T_{EMAP,i}|c_0}\{\log_2(1 + T_{EMAP,i})\}$$

$$= E_{T_{EMAP,i}|c_0}\{\log_2(D_{EMAP,i})\}.$$

Since $D_{EMAP} = D_{EpMAP}$, we further have $$I_{E_i}^{BIAWGN} = E_{T_{EMAP,i}|c_0}\{\log_2(D_{EpMAP,i})\}$$

$$= E_{T|c_0}\left\{\log_2\left(\prod_{S \in P(I_{i,1}^\pm) \backslash \phi} \left(1 + \prod_{\ell=1,\ell \neq i}^n T_\ell^{\vee_{j \in S}(c_{j,\ell}^\pm)}\right)^{(-1)^{|S|+1}}\right)\right\}$$

$$= E_{T|c_0}\left\{\sum_{S \in P(I_{i,1}^\pm) \backslash \phi} (-1)^{|S|+1} \log_2\left(1 + \prod_{\ell=1,\ell \neq i}^n T_\ell^{\vee_{j \in S}(c_{j,\ell}^\pm)}\right)\right\}$$

$$= \sum_{S \in P(I_{i,1}^\pm) \backslash \phi} (-1)^{|S|+1} E_{T|c_0}\left\{\log_2\left(1 + \prod_{\ell=1,\ell \neq i}^n T_\ell^{\vee_{j \in S}(c_{j,\ell}^\pm)}\right)\right\}. \quad (29)$$

Define $V(S) = \{\ell \in \{1, \ldots, n\} | \vee_{j \in S} c_{j,\ell}^\perp = 1\}$, then the $E\{\cdot\}$ term in (29) is the extrinsic information of a $(|V(S)|, |V(S)|-1)$ single parity-check code. Since all-zero codeword is transmitted, according to Theorem 4.5, we have $$E_{T|c_0}\left\{\log_2\left(1 + \prod_{\ell=1,\ell \neq i}^n T_\ell^{\vee_{j \in S}(c_{j,\ell}^\pm)}\right)\right\} =$$

$$\frac{1}{\ln 2} \sum_{j=1}^\infty \frac{1}{(2j)(2j-1)} \left(\prod_{\ell \in V(S), \ell \neq i} E\{T_\ell^{2j} | X_\ell = +1\}\right),$$

with which (29) becomes $$I_{E,i}^{BIAWGN} = \sum_{S \in P(I_{i,1}^\perp) \backslash \phi} (-1)^{|S|+1} \frac{1}{\ln 2} \sum_{j=1}^{\infty} \frac{1}{(2j)(2j-1)}$$

$$\left( \prod_{\ell \in V(S), \ell \neq i} E\{T_\ell^{2j} | X_\ell = +1\} \right)$$

$$= \frac{1}{\ln 2} \sum_{S \in P(I_{i,1}^\perp) \backslash \phi} (-1)^{|S|+1} \sum_{j=1}^{\infty} \frac{1}{(2j)(2j-1)}$$

$$\left( \prod_{\ell \in V(S), \ell \neq i} \Phi_j(m_\ell) \right),$$

where $m_l$ is the mean of the "soft bit" estimation passed from the channel to the MAP decoder for $X_l$ given that $X=+1$ is transmitted. Note that such a BIAWGN channel can either be a communication channel or an extrinsic channel. It is also noted that the EXIT functions in the form of multiple EXIT functions of the same code in BEC channel, cannot be expanded.

For high rate codes, we have $D_{EMF} \cong D_{EpMAP}$ when the all-zero codeword is transmitted over the BIAWGN channel, and Theorem 4.2 can be used to approximately compute the extrinsic information at the output of the MAP decoder for a linear block code. Note that Hadamard codes are low rate codes. For a low rate code, the extrinsic information can be approximated by $$I_{E,i}^{BIAWGN}(I_{A,1}, \ldots, I_{A,n}) \cong 1 - I_{E,i}^{\perp, BIAWGN}(1 - I_{A,1}, \ldots, 1 - I_{A,n}), \quad (30)$$

where $I_{E,i}^{\perp, BIAWGN}(1-I_{A,1}, \ldots, 1-I_{A,n})$ is the extrinsic information of its high-rate dual code and can be computed by Theorem 4.2 with $m_l = W^{-1}(1-I_{A,l})$.

EXIT Functions for Hadamard Codes over BIAWGN Channel

Next we consider the EXIT functions of Hadamard codes in the context of RZH codes with parallel decoding. We first consider the average mutual information about the information bits $\underline{d}$ which is given by $$I_{E,d}^{BIAWGN} = \frac{1}{r} \sum_{i=1}^{r} I_{E,d_i}^{BIAWGN},$$

Where $I_{E,d_i}^{BIAWGN}$ can be computed by (30).

Let $\underline{c}_j = [c_{j,1}, c_{j,2}, \ldots, c_{j,n}]^T$ denote the j-th codeword of the Hadamard code over GF(2). For $\underline{c}_j$, we have $c_{j,2^{i-1}+1} = d_{j,i}$ for $i=1, \ldots, r$. Denote by $I_{i,1}^{H,d} = \{j | c_{j,2^{i-1}+1} = 1\}$, for $i=1, \ldots, r$, the set of indices of all Hadamard codewords with the i-th systematic bit equal 1, and $P(I_{i,1}^{H,d})$ the set of all subsets of $I_{i,1}^{H,d}$. Since a Hadamard codeword can be divided into systematic bits, parity bits and connection bits, we have $\underline{c}_j = \{d_j, \underline{p}_{j,[m]}, q_j, p_{j,m}\}$ where $\underline{p}_{j,[m]}$ denotes the parity bits exclusive of $p_{j,m}$. Let $S \in P(I_{i,1}^{H,d})$. The following definitions will be used:

$$V(S, \underline{d}) \triangleq \{\ell \in \{1, \ldots, r\} | \vee_{j \in S} d_{j,\ell} = 1\} \quad (31)$$

$$V(S, \underline{p}_{[m]}) \triangleq \{\ell \in \{1, \ldots, m-1\} | \vee_{j \in S} p_{j,\ell} = 1\} \quad (32)$$

$$V(S, q) \triangleq \{\ell \in \{1\} | \vee_{j \in S} q_{j,\ell} = 1\} \quad (33)$$

$$V(S, p_m) \triangleq \{\ell \in \{m\} | \vee_{j \in S} p_{j,\ell} = 1\} \quad (34)$$

where "$\vee$" is the logical "or" operation. It is clear that $V(S,q)$ is either $\{1\}$ or $\phi$. Further define $$A_{g,h,j,k}^{d_i, odd} \triangleq |\{S \in P(I_{i,1}^{H,d}) | |V(S, q)|$$
$$= g, |V(S, \underline{d})|$$
$$= h, |V(S, \underline{p}_{[m]})|$$
$$= j, |V(S, p_m)|$$
$$= k, |S| \text{ is odd}\}|$$

and $$A_{g,h,j,k}^{d_i, odd} \triangleq |\{S \in P(I_{i,1}^{H,d}) | |V(S, q)|$$
$$= g, |V(S, \underline{d})|$$
$$= h, |V(S, \underline{p}_{[m]})|$$
$$= j, |V(S, p_m)|$$
$$= k, |S| \text{ is even}\}|.$$

Then we have the following results for Hadamard codes that will be subsequently used:

Lemma 4.1.

For Hadamard codes C with order r, we have $$A_{g,h,j,k}^{d_1, odd} = A_{g,h,j,k}^{d_2, odd} = \cdots = A_{g,h,j,k}^{d_r, odd} \triangleq A_{g,h,j,k}^{d, odd},$$

and $$A_{g,h,j,k}^{d_1, even} = A_{g,h,j,k}^{d_2, even} = \cdots = A_{g,h,j,k}^{d_r, even} \triangleq A_{g,h,j,k}^{d, even}.$$

Proof:

Since $A_{g,h,j,k}^{d_i, odd}$ and $A_{g,h,j,k}^{d_i, even}$ are based on the subcode $C_i = \{\underline{c}_j | c_{j,2^{i-1}+1} = 1, \underline{c}_j \in C\}$, $i=1, \ldots, r$, we only need to show that for $l \neq i$, there is a $C_l^*$ which is constructed from $C_l$ by only switching coded bits within the systematic bit positions and/or the parity bit positions, such that $C_i = C_l^*$. Let the generation matrix of C in systematic form be $\underline{G}_{H,r}$ with $\underline{g}_0$ and $\underline{g}_i$ ($i=1, \ldots, r$) being the rows of $\underline{G}_{H,r}$ corresponding to the connection bit and the i-th information bit, respectively. Suppose that the input of the Hadamard encoder is $\underline{d} = [d_0 = q, d_1, \ldots, d_r]^T$, then the codewords belong to $C_i$ are given by $$\left\{ \underline{g}_i^T + \sum_{\ell \neq i} d_\ell \underline{g}_\ell^T \right\}$$

for all possible $\{d_l\}_{l \neq i}$. Since $\underline{G}_{H,r}$ is in systematic form, $\underline{g}_i$ can be written as $[\underline{u}_i, \underline{p}_i]$ where $\underline{u}_i = [u_0, u_1, \ldots, u_r]$ with $u_l = 0$ for $l \neq i$ and $u_i = 1$. By switching the rows $\underline{g}_i$ and $\underline{g}_l$, we obtain $\underline{G}_{H,r}^{(1)}$ with $\underline{g}_i^{(1)} = \underline{g}_l$ and $\underline{g}_l^{(1)} = \underline{g}_i$. It is clear that the subcode $C_i^{(1)}$ generated by $\underline{G}_{H,r}^{(1)}$ is identical to $C_i$. We further construct $\underline{G}_{H,r}^{(2)}$ from $\underline{G}_{H,r}^{(1)}$ by letting $(\underline{g}_i^{(2)} = \underline{g}_i^{(1)} + (\underline{g}_l^{(1)} + \underline{g}_i^{(1)}) = \underline{g}_l^{(1)} = \underline{g}_i$, and $\underline{g}_l^{(2)} = \underline{g}_l^{(1)} + (\underline{g}_l^{(1)} + \underline{g}_i^{(1)}) = \underline{g}_i^{(1)} = \underline{g}_l$, by which we have $\underline{G}_{H,r}^{(2)} = \underline{G}_{H,r}^{(1)}$ and hence $C_i^{(2)} = C_i$. The effect of transforming $\underline{G}_{H,r}^{(1)}$ to $\underline{G}_{H,r}^{(2)}$ is only to change the order of the coded bits. Since both codes are systematic codes, there is one order change between systematic bit position i and l (note that there are only two 1's in $\underline{u}_i+\underline{u}_l$), and all the other changes are happened between parity bit positions. It is clear that $C_i^{(2)}=C_l$ is the $\cdot C_l^*$ we are looking for and this concludes the proof.

In case that the size of the code book is not huge, it is easy to compute $A_{g,h,j,k}^{d,even}$ and $A_{g,h,j,k}^{d,odd}$ directly from their definitions given the codewords are known. With the above results, the average mutual information about the information bits $\underline{d}$ can be computed by the following result.

Theorem 4.3.

If the extrinsic and communication channels are AWGN channels with respective mutual information $I_{A,d}$, $I_{A,p}$, $I_{A,q}$ and $I_{A,p_m}$, we have $$I_{E,d}^{BIAWGN} \cong 1 - \frac{1}{\ln 2} \sum_{g=0}^{1} \sum_{h=0}^{r} \sum_{j=0}^{m-1} \sum_{k=0}^{1} \left( \begin{array}{c} A_{g,h,j,k}^{d,odd} \\ A_{g,h,j,k}^{d,even} \end{array} \right) \sum_{i=1}^{\infty} \frac{1}{(2i)(2i-1)} \cdot$$

$$\Phi_i^g(m_q)\Phi_i^h(m_d)\Phi_i^j(m_p)\Phi_i^k(m_{p_m}), \quad (35)$$

where $m_q=W^{-1}(1-I_{A,q})$, $m_d=W^{-1}(1-I_{A,d})$, $m_p=W^{-1}(1-I_{A,p})$ and $M_{p_m}=W^{-1}(1-I_{A,p_m})$. Note that here for simplicity, $I_{A,p_m}$ denotes the overall mutual information about $p_m$ from both the communication channel and the extrinsic channel.

Proof:

Using Theorem 4.2, (30) and Theorem 4.1, we obtain the above result. Now consider the connection bit q. Similarly, we denote by $I_1^{H,q}=\{j|c_{j,1}=1\}$ the set of indices of all Hadamard codewords with the connection bit equal 1, and $P(I_1^{H,q})$ the set of all subsets of $I_1^{H,q}$. Let $S \in P(I_1^{H,q})$, then we can obtain $V(S,\underline{d})$, $V(S,\underline{p}_{[m]})$, and $V(S, p_m)$ as in (31), (32) and (34). Define $$A_{h,j,k}^{q,odd} \triangleq |\{S \in P(I_1^{H,q})||V(S, \underline{d})| = h, |V(S, \underline{p}_{[m]})| = j, |V(S, p_m)| = k, |S| \text{ is odd}\}|$$

and $$A_{h,j,k}^{q,odd} \triangleq |\{S \in P(I_1^{H,d})||V(S, \underline{d})| = h, |V(S, \underline{p}_{[m]})| = j, |V(S, p_m)| = k, |S| \text{ is even}\}|.$$

Then similar to Theorem 4.3, the mutual information of q can be computed by the following result.

Theorem 4.4.

If the extrinsic and communication channels are AWGN channels with respective mutual information $I_{A,d}$, $I_{A,p}$ and $I_{A,p_m}$, then we have $$I_{E,q}^{BIAWGN} \cong 1 - \frac{1}{\ln 2} \sum_{h=0}^{r} \sum_{j=0}^{m-1} \sum_{k=0}^{1} (A_{h,j,k}^{d,odd} - A_{h,j,k}^{d,even}) \sum_{i=1}^{\infty} \frac{1}{(2i)(2i-1)} \cdot \quad (36)$$

$$\Phi_i^h(m_d)\Phi_i^j(m_p)\Phi_i^k(m_{p_m}),$$

where $m_d=W^{-1}(1-I_{A,d})$, $m_p=W^{-1}(1-I_{A,p})$ and $m_{p_m}=W^{-1}(1-I_{A,p_m})$. Again, here $I_{A,p_m}$ represents the overall mutual information about $p_m$ from both the communication channel and the extrinsic channel.

Now consider the last parity bit $p_m$. Since $p_m$ has a channel observation $y_m$, the EXIT function of the last parity bit $p_m$ is different from that of q. Again, let C* be a new code formed by all pairs $(\underline{d}, \underline{p}, q, p_m)$, then we can define $I_1^{H,p_m}=\{j|p_{j,m}=1\}$ the set of indices of all codewords in C* with $p_{j,m}$ equal 1, and $P(I_1^{H,p_m})$ the set of all subsets of $I_1^{H,p_m}$. Let $S \in P(I_1^{H,p_m})$, then similar to the case for q, we can obtain $V(S,q)$, $V(S,\underline{d})$, and $V(S,\underline{p})$, with which we can define $$A_{g,h,j}^{p_m,odd} \triangleq |\{S \in P(I_1^{H,p_m})||V(S, q)| = g, |V(S, \underline{d})| = h, |V(S, \underline{p})| = j, |S| \text{ is odd}\}|$$

and $$A_{g,h,j}^{p_m,odd} \triangleq |\{S \in P(I_1^{H,p_m})||V(S, q)| = g, |V(S, \underline{d})| = h, |V(S, \underline{p})| = j, |S| \text{ is even}\}|.$$

by which we can compute the EXIT function for $p_m$ as follows.

Theorem 4.5.

If the extrinsic and communication channels are AWGN channels with respective mutual information $I_{A,q}$, $I_{A,d}$ and $I_{A,p}$, then we have $$I_{E,p_m}^{BIAWGN} \cong 1 - \frac{1}{\ln 2} \sum_{g=0}^{1} \sum_{h=0}^{r} \sum_{j=0}^{m} \left( \begin{array}{c} A_{g,h,j}^{p_m,odd} \\ A_{g,h,j}^{p_m,even} \end{array} \right) \sum_{i=1}^{\infty} \frac{1}{(2i)(2i-1)} \cdot \quad (37)$$

$$\Phi_i^g(m_q)\Phi_i^h(m_d)\Phi_i^j(m_p),$$

where $m_q=W^{-1}(1-I_{A,q})$, $m_d=W^{-1}(1-I_{A,d})$ and $m_p=W^{-1}(1-I_{A,p})$.

Numerical Example

The following example demonstrates the computing of EXIT functions for Hadamard codes.

Example 1

Figure 6:
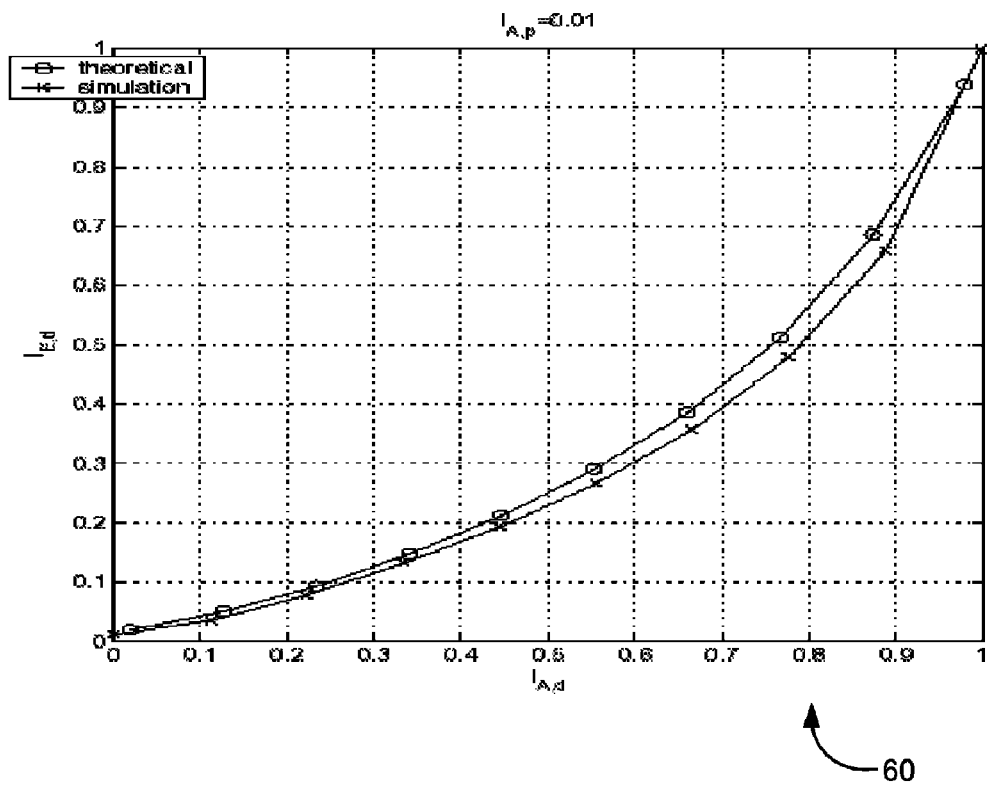
FIG. 6 is a graph of an extrinsic information transfer function (EXIT) of information bits in BIAWGN channel.

Consider a Hadamard code with r=4. The code book of C can be easily obtained, from which we are able to obtain $A_{g,h,j,k}^{d,even}$ and $A_{g,h,j,k}^{d,odd}$. Let $I_{A,p}=0.01$, and $I_{A,q}=I_{A,p_m}=I_{A,d}$, then the EXIT function of the information bits has only one variable $I_{A,d}$, and we are able to obtain $I_{E,d}$ as a function of $I_{A,d}$ by using Theorem 4.3 which is plotted 600 in FIG. 6. Also depicted in FIG. 6 are the simulated EXIT curve with the same setting. It is seen that the EXIT function over BIAWGN channel provides an optimistic estimation of the simulated one.

BER Estimation of RZH Codes with Parallel Decoding

For an (n,k) IRZH codes, the outer code consists of k repetition codes with variable rates and the EXIT functions of repetition decoders are identical to the case where the serial decoding is employed. Also, since the connection bit nodes are viewed as variable nodes with degree 2, the corresponding EXIT functions for q and $p_m$ are simply the EXIT functions for rate ½ repetition code without message from the channel. Now we have both the EXIT functions of the outer repetition decoder and the inner Hadamard decoder, we can then trace the mutual information exchanged between the two constituent components for a given degree profile and calculate the corresponding BER after a given number of iterations as in [?], with which we are able to perform degree profile optimization by using differential evolution (DE).

Specifically, let $I_{ch}$ be the mutual information about the LLRs of the coded bits transmitted from the communication channel. For a BIAWGN channel with $$\frac{E_s}{N_0} = R_c \cdot \frac{E_b}{N_0}, \text{ we have } I_{ch} = W(2\sigma_{ch}^2) = W\left(\frac{16E_s}{N_0}\right).$$

Also let $I_{A,a}{}^H$, $I_{A,q}{}^H$, $I_{A,p_m}{}^H$ be the mutual information about the a priori LLRs passing from the repetition decoder to the Hadamard decoder (the extrinsic channels) for the information bits, connection bit and the last parity bit, respectively, which are initialized to zero for the first iteration. With $I_{ch}$, $I_{A,a}{}^H$, $I_{A,q}{}^H$ and $I_{A,p_m}{}^H$, as the inputs, we are able to compute the output mutual information $I_{E,a}{}^H$, $I_{E,q}{}^H$ and $I_{E,p_m}{}^H$ of the Hadamard decoder with the previously derived EXIT functions in BIAWGN channels. For BIAWGN channels, the mean of the "soft output" of the extrinsic channel is computed by $m = W^{-1}(I_A)$. The output mutual information of the Hadamard decoder will then serve as the input $I_{A,VND}$ for the EXIT functions of the corresponding repetition decoder, which will produce the corresponding $I_{E,VND}$ and feed back to the EXIT functions of the Hadamard decoder as the new inputs for the next iteration. After a given number of iteration, the mutual information passed to the outer repetition decoder is $I_{A,VND}$, then the BER is given by $$P_b = \sum_{i=1}^{D} a_i Q\left(\sqrt{\frac{1}{2}W\left(\frac{1}{2}(2d_v W^{-1}(I_{A,VND}) + \sigma_{ch}^2)\right)}\right), \quad (38)$$

where $$Q(x) \triangleq \frac{1}{\sqrt{2\pi}} \int_{-\infty}^{x} \exp(-t^2/2)dt.$$

Code Ensemble Optimization

For given r and $R_c$, the optimal IRZH ensemble parameters $\{a_i\}$ are the one that minimize $E_b/N_0$, subject to a vanishing BER $P_b$. In practice, the vanishing BER condition is often replaced by a BER threshold $\epsilon$ for a given iteration number $N_{it}$, i.e., $P_b(N_{it}) \leq \epsilon$, which leads to the following optimization problem $$\min E_b/N_0 \text{ s.t.} \sum_i a_i = 1, a_i \geq 0, \forall i \text{ and } P_b(N_{it}) < \epsilon. \quad (39)$$

To solve (17) for irregular RZH codes with parallel decoding, we resort to the differential evolution (DE) algorithm, which is a powerful population-based genetic algorithm and was introduced for finding the optimal degree profile of the irregular LDPC codes. The essential idea behind DE is a self-organizing scheme to generate a trial parameter vector (which is $\{a_i\}$ in our case) by adding the weighted difference between two population vectors of the current generation to a third vector which is the target vector. If the trial vector has a smaller cost value (which is $P_b$ in our case and can be estimated by using the EXIT functions of the component codes as discussed in Section 1) than the target vector, it survives into the next generation of the evolution. After a given number of evolutions, the vector with the smallest cost value among the population of current generation is the optimized parameter vector. Note that although there is no mathematical convergence proof of DE, it is believed to be a simple and reliable global optimization method. To find the solution to (17) for given $R_c$ and r, we first choose an $E_b/N_0$ and find a degree profile $\{a_i\}$ using DE that satisfies the BER constraint $\epsilon$. If at least one $\{a_i\}$ exists, the $E_b/N_0$ is reduced and the procedure is repeated until no such a vector $\{a_i\}$ exists. The smallest value of $E_b/N_0$ for which a power profile $\{a_i\}$ satisfies the BER constraint is the desired minimum SNR and the corresponding $\{a_i\}$ is the optimized degree profile.

Numerical Results

The following are several examples for RZH code optimization with the previously proposed design methods.

Examples with Serial Decoding

Figure 7:
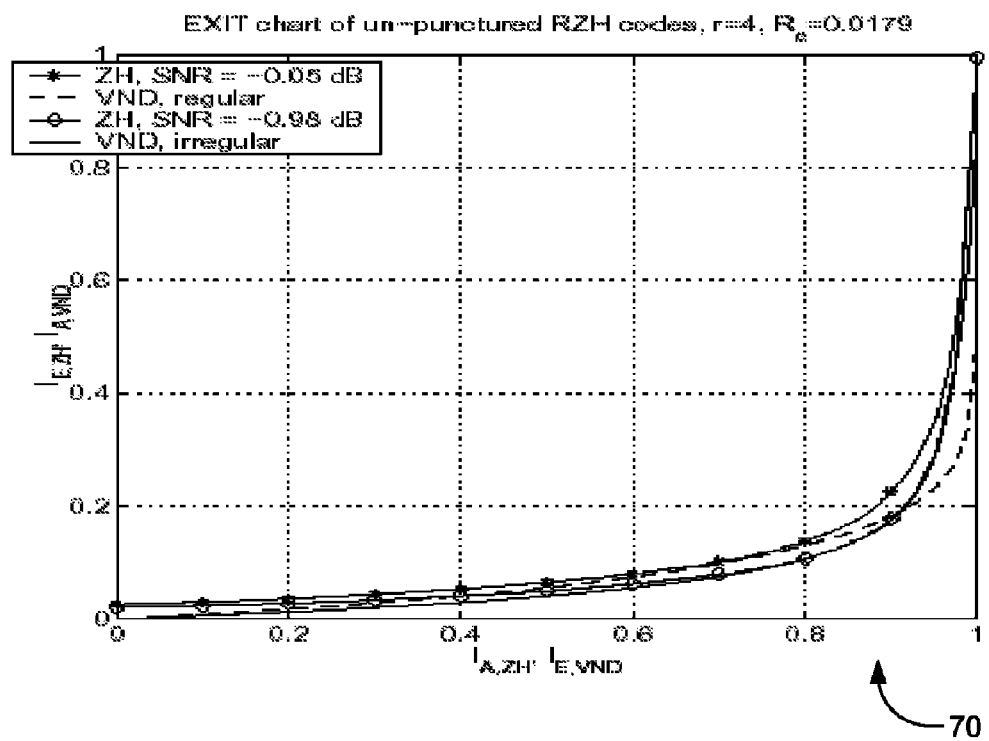
FIG. 7 is a graph of an EXIT chart of un-punctured RZH codes with r=4 and $R_c$=0.0179 in the case of serial decoding in accordance with the invention.

An un-punctured regular RZH code with r=4 and $d_v$=14 which results in a coding rate of around 0.018. FIG. 7 plots the EXIT chart of this code, from which it can be seen that the corresponding SNR threshold is around −0.05 dB. Now consider the irregular code with $\bar{d}_v$=14. With code ensemble optimization, we are able to obtain an irregular code at $$\frac{E_b}{N_0} = -0.98 \text{ dB}$$

where the degree profile polynomial is given by f(x)= $0.323x^3 + 0.175x^8 + 0.026x^{22} + 0.476x^{23}$. The corresponding EXIT chart for $$\frac{E_b}{N_0}$$

−0.98 dB is also plotted 700 in FIG. 7, where the solid line denotes the EXIT function of the outer mixture repetition codes with the optimized profile and diamond denotes the EXIT function of the inner ZH code.

Figure 8:
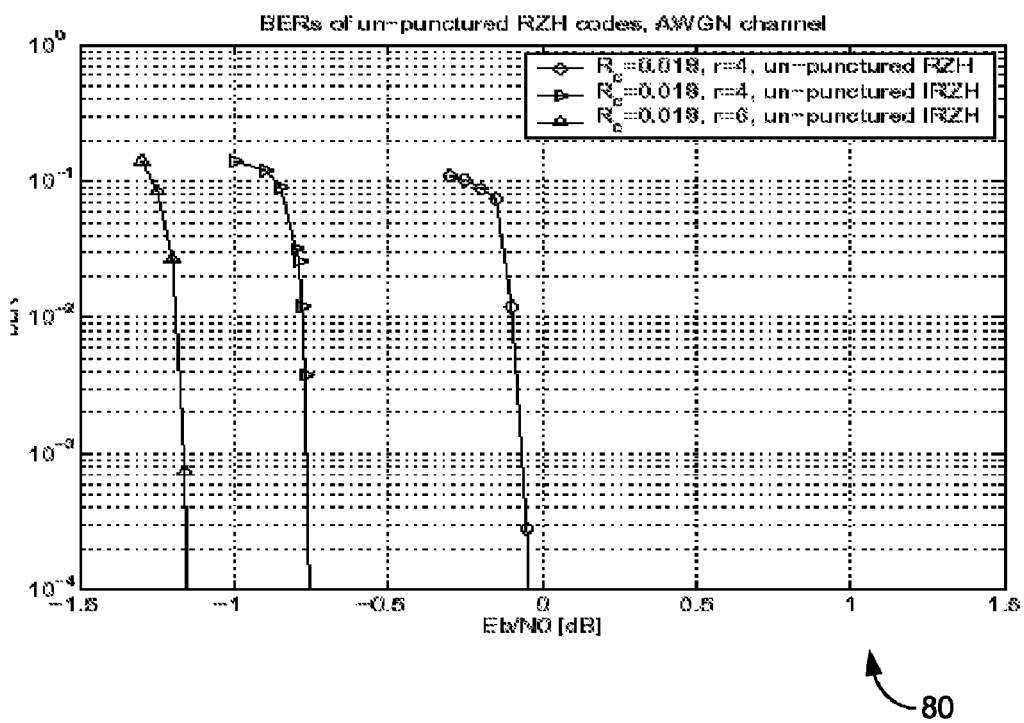
FIG. 8 is a graph of bite error rates BERs for un-punctured RZG codes, with an information block length of 65536 and a maximum iteration number of 150, in the case of serial decoding in accordance with the invention.

The graph 800 of FIG. 8 plots the simulated BER results of the regular and irregular un-punctured RZH codes with an information block length of 65536 and a maximum iteration number of 150. It is seen that with r=4, the optimized un-punctured IRZH code has a gain of 0.71 dB (measured at $P_b = 10^{-4}$) over the regular code, whereas the gap to the capacity is around 0.8 dB. With larger r, better codes can be obtained. For instance, for r=6, we obtain a code which is optimized at $$\frac{E_b}{N_0} = -1.30 \text{ dB}$$

with f(x)=$0.363x^3 + 0.338x^6 + 0.299x^7$, and the simulated threshold (measured at $P_b = 10^{-4}$) is −1.13 dB, which is only 0.41 dB away from the capacity.

Figure 9:
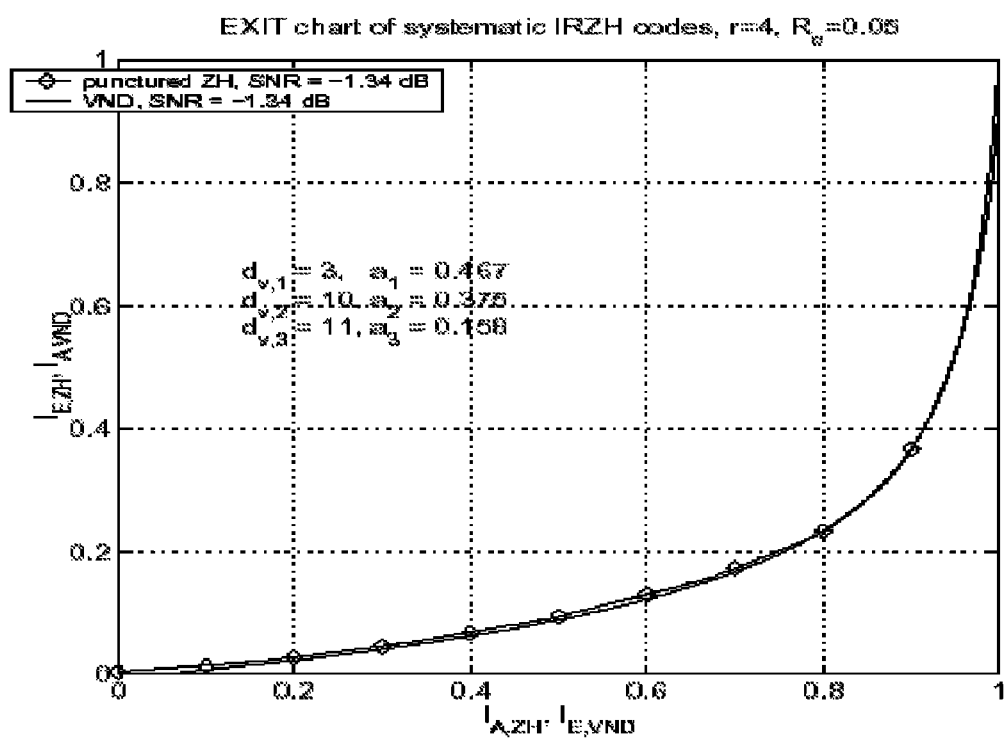
FIG. 9 is a graph of an EXIT chart of systematic RZH codes with r=4 and $R_c$=0.05.
Figure 10:
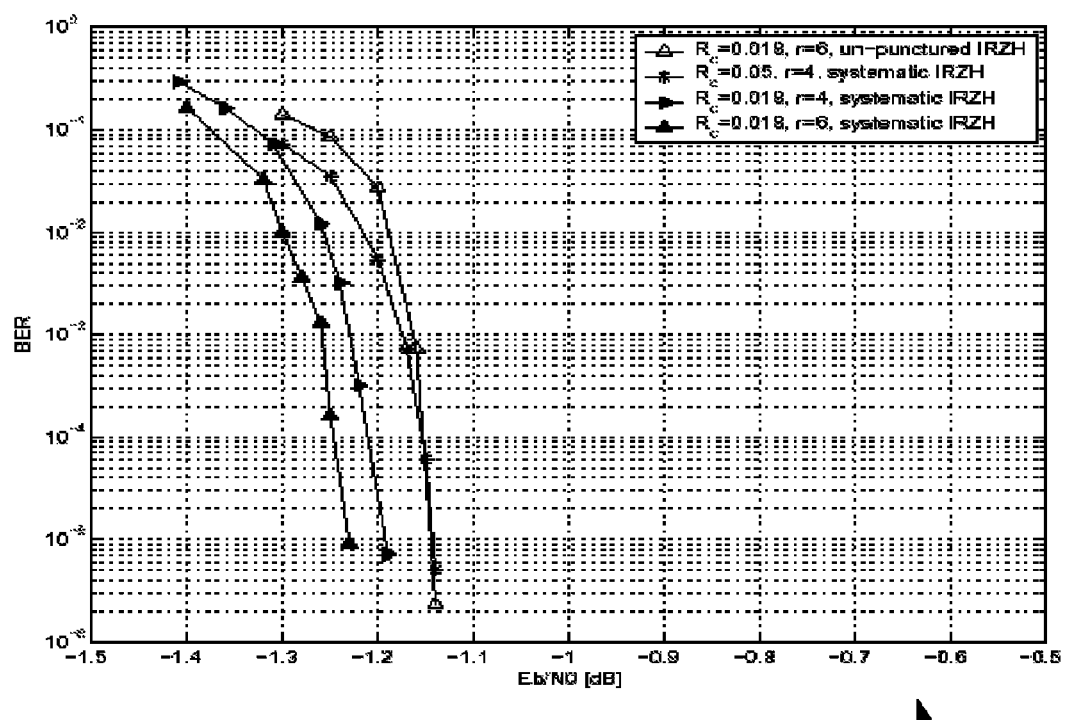
FIG. 10 is a graph of bite error rates BERs for un-punctured IRZH codes, with an information block length of 65536 and a maximum iteration number of 150, in the case of serial decoding in accordance with the invention.

Next is the ensemble optimization of the systematic IRZH codes. Since the repetition bits are punctured, much better performance can be expected. Indeed, for r=4 and $R_c$=0.05, we are able to obtain an irregular code at $$\frac{E_b}{N_0} = -1.34 \text{ dB}$$

with f(x)=$0.467x^3+0.375x^{10}+0.158x^{11}$, which is only 0.1 dB away from the capacity. The EXIT chart of the curve-fitting result 900 is shown in FIG. 9 and the BER performance is shown 1001 in FIG. 10. Results show that the simulated SNR threshold is −1.14 dB (only around 0.31 dB away from the capacity) which is much better than that of the optimized un-punctured code with the same r and a much lower (0.0179) coding rate. The graph 1001 of FIG. 10 also depicts the BER performance of a lower rate code with r=4 and $R_c$=0.018 which is optimized at $$\frac{E_b}{N_0} = -1.42 \text{ dB}$$

with f(x)=$0.364x^3+0.014x^{11}+0.192x^{12}+0.074x^{13}+0.095x^{36}+0.136x^{37}+0.1087x^{38}+0.004x^{39}+0.013x^{200}$, and the simulated SNR threshold is around −1.2 dB, which is 0.34 dB away from the capacity and around 0.8 dB better than the same rate un-punctured code with r=6. With r=6, a code is optimized at $$\frac{E_b}{N_0} = -1.43 \text{ dB}$$

with f(x)=$0.401x^3+0.573x^7+0.026x^{20}$, and the simulated SNR threshold is −1.24 dB, which is slightly better than that of r=4.

Examples with Parallel Decoding

Figure 11:
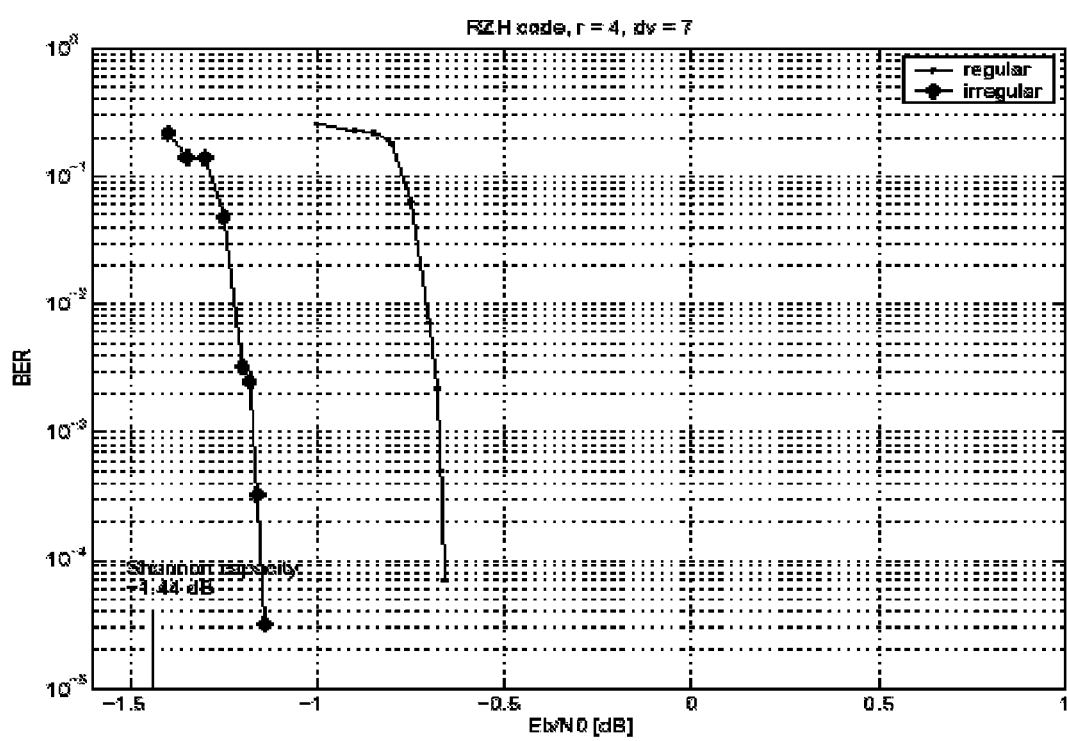
FIG. 11 is a graph of BER performance of irregular RZH codes over BIAWGN channel, in the case of parallel decoding in accordance with the invention.

Next some design examples of IRZH codes with parallel decoding are provided. First the performance of the regular code with parallel decoding is considered. Consider a regular systematic RZH code with r=4 and $\bar{d}_v$=7 which corresponds to a rate of 0.0494. The graph 110 of FIG. 11 depicts the simulated BER performance of this code. The simulated SNR threshold (measured at $P_b=10^{-4}$) is around −0.66 dB which is 0.78 dB away from the Shannon capacity −1.44 dB. To obtain better performance, we resort to irregular codes. For the code design, we set the BER threshold $\epsilon=10^{-4}$. With AWGN EXIT function, we are able to optimize a code at −1.25 dB with f(x)=$0.4353x^3+0.0072x^4+0.0016x^5+0.0099x^8+0.1759x^9+0.1829x^{10}+0.0800x^{11}+0.1071x^{12}$, which is only 0.19 dB away from the capacity. The simulated SNR threshold for this code is −1.15 dB, which is only 0.29 dB away from the capacity and has a gain of 0.49 dB over the regular one. Next we provide another example of code design using EXIT functions over BIAWGN channel.

Example

Figure 12:
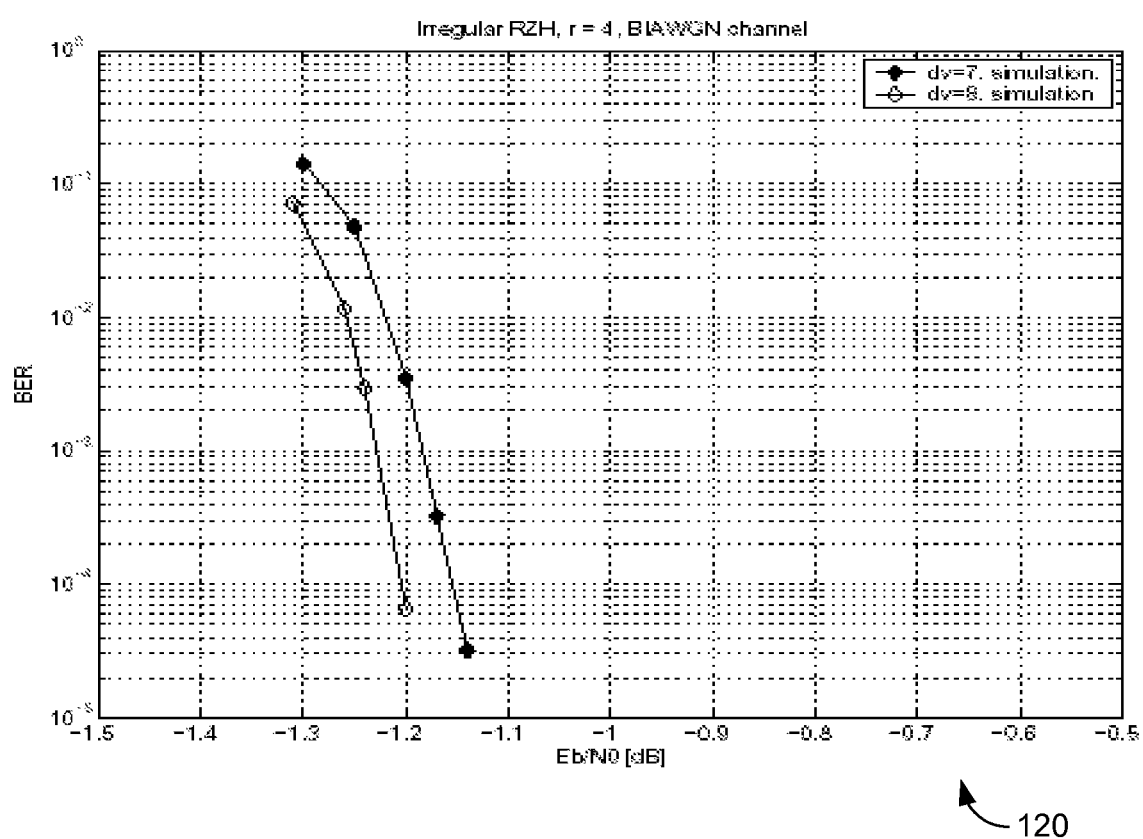
FIG. 12 is a graph of BER performance of irregular RZH codes over BIAWGN channel, in the case of parallel decoding in accordance with the invention.

By setting r=4 and $\bar{d}_v$=8, the systematic RZH code has a rate of 0.0435. The Shannon limit for this code is −1.46 dB. Again, with EXIT functions over BIAWGN channel, we are able to optimize a code at −1.34 dB with f(x)=$0.4044x^3+0.0026x^4+0.0048x^5+0.0245x^6+0.0453x^8+0.0669x^9+0.0296x^{10}+0.0203x^{11}+0.0985x^{12}+0.3030x^{13}$, which is only 0.12 dB away from the capacity. BER performance of this code is depicted 120 in FIG. 12. It is seen that the simulated SNR threshold for this code is −1.2 dB, which is only 0.26 dB away from the capacity and 0.4 dB away from the ultimate Shannon limit. It is seen that the proposed EXIT functions in AWGN channel are a good approximation in the considered rate region and can be served as a practical tool for the low-rate IRZH code design.

Figure 4A:
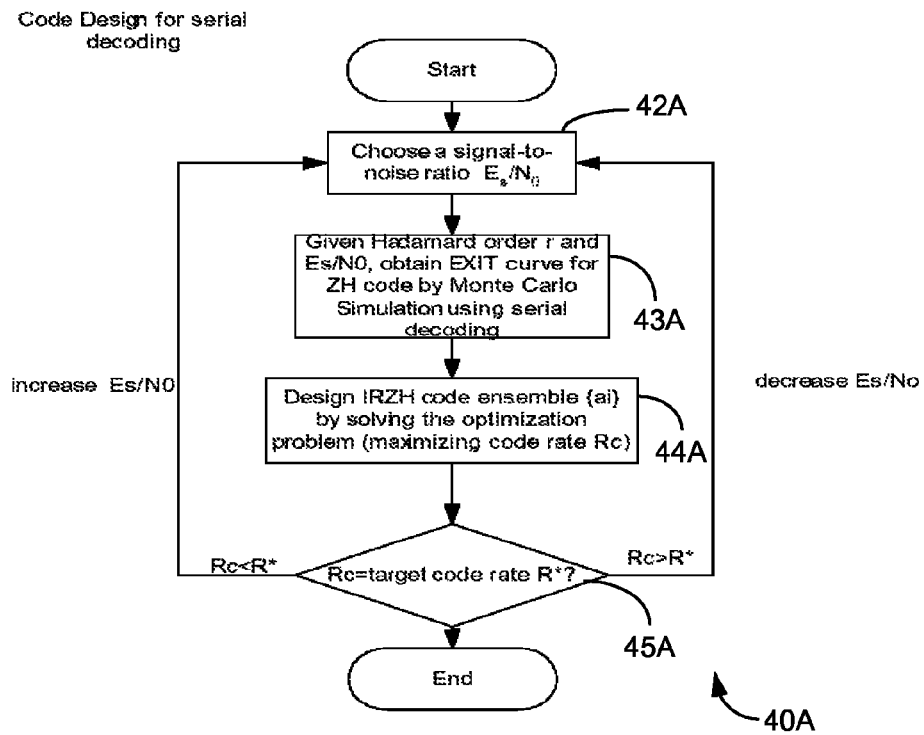
FIG. 4A is a flow chart of the method for code design for serial decoding in accordance with the invention.
Figure 5A:
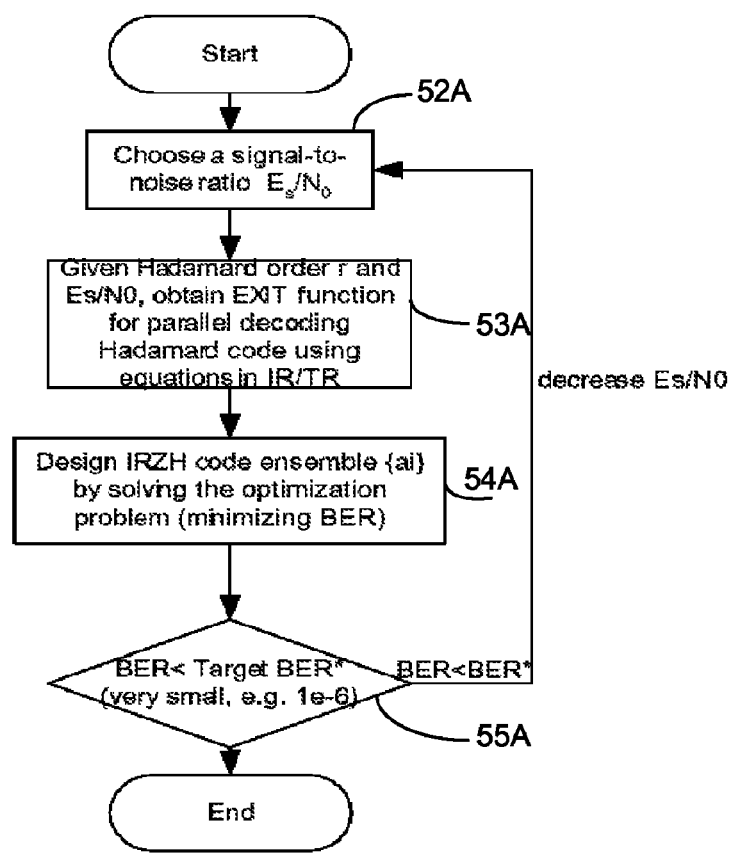
FIG. 5A is a flow chart of the method for code design for parallel decoding in accordance with the invention.

The method for code design for IRZH codes is detailed by flow chart 40A in FIG. 4A for serial decoding and flow chart 50A in FIG. 5A for parallel decoding. The method is a mutual-information-based code design for both the serial and parallel decoding schemes.

Design for Serial Decoding

The decoding of RZH code is based on its tanner graph 30 which is depicted in FIG. 3. For turbo-like serial decoding, the inner decoder utilizes the trellis structure of the zigzag-Hadamard code and the common bits participate in the two-way decoding of ZH codes. Extrinsic information about the information bits is exchanged between the inner ZH decoder and outer repetition decoder, see FIG. 4.

Chart 40A details the steps for IRZH code design for serial decoding. Step 1: a small signal to noise ratio $E_s/N_0$ is initially chosen 42A. Step 2: for a given Hadamard order r and $E_s/N_0$, the EXIT curve for ZH code is obtained by Monte Carlo simulation using serial decoding 43A. Step 3: with the obtained EXIT curve there is an attempt to find the optimal IRZH ensemble parameters $\{a_i\}$ that maximize coding rate subject to vanishing BER by solving the following optimization problem $$\max R_c \text{ s.t.} \sum_i a_i = 1, a_i \geq 0, \forall i \text{ and } P_b(E_s/N_0) = 0.$$

This problem can be solved by any linear optimization program 44A. The vanishing BER condition can be implemented by checking the existence of a decoding tunnel between the EXIT curve of the ZH code obtained in step 2 and that of outer repetition codes. Namely, the curve defined by a particular degree profile lies below the EXIT curve of ZH code in the EXIT chart. Step 4: if the maximum rate obtained by step 3 is smaller than the target rate, the signal to noise ratio $E_s/N_0$ is increased by a small amount and step 2 and 3 are repeated, until the obtained achievable rate equals to the target rate 45A.

Design for Parallel Decoding

As in FIG. 3, depicting the Tanner graph 30 of RZH codes, for LDPC-like parallel decoding the variable nodes of common bits are viewed as degree-2 information bit nodes and extrinsic LLRs about information bits and common bits are parallel exchanged between the outer repetition decoder and inner Hadamard decoder.

Chart 50A details the steps for IRZH code design for parallel decoding. Step 1: a relatively large signal to noise ratio SNR $E_b/N_0$ is initially chosen 52A. Step 2: for a given Hadamard order r coding rate $R_c$ and SNR, a degree profile that has minimum BER by using deferential evolution (DE) is found 53A. During the DE optimization, BER is computed, which can be done by a mutual information tracking scheme. EXIT functions of the Hadamard codes in AWGN channel are derived, with which the BER can be easily estimated 54A. Specifically, the EXIT functions for the information bits are given by:

$$I_{E,d}^{BIAWGN} \cong 1 - \frac{1}{\ln 2} \sum_{g=0}^{1} \sum_{h=0}^{r} \sum_{j=0}^{m-1} \sum_{k=0}^{1} \left( A_{g,h,j,k}^{d,odd} - A_{g,h,j,k}^{d,even} \right)$$

$$\sum_{i=1}^{\infty} \frac{1}{(2i)(2i-1)} \cdot \Phi_i^g(m_q) \Phi_i^h(m_d) \Phi_i^j(m_p) \Phi_i^k(m_{P_m}),$$

similarly, the EXIT function for the connection bits can be computed by $$I_{E,q}^{BIAWGN} \cong 1 - \frac{1}{\ln 2} \sum_{h=0}^{r} \sum_{j=0}^{m-1} \sum_{k=0}^{1} \left( A_{h,j,k}^{d,odd} - A_{h,j,k}^{d,even} \right)$$

$$\sum_{i=1}^{\infty} \frac{1}{(2i)(2i-1)} \cdot \Phi_i^h(m_d) \Phi_i^j(m_p) \Phi_i^k(m_{P_m}),$$

and the EXIT function for the last parity bit is given by $$I_{E,P_m}^{BIAWGN} \cong 1 - \frac{1}{\ln 2} \sum_{g=0}^{1} \sum_{h=0}^{r} \sum_{j=0}^{m} \left( A_{g,h,j}^{P_m,odd} - A_{g,h,j}^{P_m,even} \right)$$

$$\sum_{i=1}^{\infty} \frac{1}{(2i)(2i-1)} \cdot \Phi_i^g(m_q) \Phi_i^h(m_d) \Phi_i^j(m_p),$$

where the details of the variables in the above equations are explained elsewhere herein. Step 4: if the minimum BER obtained by step 2 is smaller than the target BER requirement, the signal to noise ratio SNR $E_b/N_0$ is reduced and step 2 is repeated, until the target BER requirement cannot be achieved 55A. The least SNR that can still achieve the BER requirement is the minimum SNR and the corresponding degree profile is the optimized degree profile.

In summary, the present code design method is optimized for IRZH codes with serial and parallel decoding schemes. For serial decoding, the EXIT functions are obtained via simulation; on the other hand, for parallel decoding, the EXIT functions of Hadamard codes in the context of RZH codes are derived. With these EXIT functions, BERs for a given code profile can be easily estimated and either curve fitting (for serial decoding) or differential evolution (DE) technique (for parallel decoding) can be employed to optimize the degree profile for the given design parameters, e.g., the coding rate and the Hadamard order. The techniques introduced in this report can also be easily extended to the design of general low-density parity-check codes where the check nodes are replaced by other linear block codes, e.g., Hadamard codes or Hamming codes.

The present code design method for irregular repeat-zigzag-Hadamard (IRZH) codes to approach capacity with turbo-like serial decoding or LDPC-like parallel decoding is quite different from current techniques and provides significant advantages. With respect to current design methods for LDPC codes, a check node of a LDPC code is a single parity-check constraint. The design procedure for LDPC codes is similar to that of IRZH codes with parallel decoding. The difference is that with the present method it is a common practice to use the analytical EXIT function of the inner check node over BEC to approximate that over BIAWGN channel. Results show that such an approximation works very well for irregular LDPC code design. However, such a BEC approximation design method provides less satisfactory results for RZH code design with parallel decoding. For instance, for r=4 and $d_v=7$, with BEC approximation, one is able to design an IRZH code with a simulated SNR threshold of −0.79 dB, whereas with the present method EXIT functions derived for AWGN channel, one can obtain a code with a simulated SNR threshold of −1.15 dB, which is only 0.29 dB away from the capacity. With respect to current design methods for LDPC-Hadamard codes, the EXIT functions of the Hadamard check nodes are obtained by Monte Carlo simulation, consequently, the optimization procedure is time-consuming. With the present design method based on the analytical EXIT functions, the optimization complexity can be significantly reduced.

The present EXIT-function-based design method offers high quality design results whereas the optimization complexity is low. Note that although density-evolution can be used for the design of IRZH code, the complexity is very high.

Although with the present turbo-like decoding, in which the inner decoder is a trellis-based zigzag-Hadamard (ZH) decoder, an analytical expression of its EXIT function is not available and there is use of Monte Carlo simulations to obtain the EXIT functions of the inner code, since the EXIT function of the inner code is a one dimension function for a given SNR the optimization complexity is still low.

For LDPC-like parallel decoding, the connection bits of the ZH code are treated as degree-2 variable nodes, and the inner constituent decoder becomes a Hadamard decoder. Although simulation can still be utilized to obtain the EXIT function, the present method derives analytical EXIT functions of Hadamard codes with multiple inputs and outputs in the context of low-rate RZH codes over BIAWGN channels, and applies these results to the analysis and design of RZH codes. With analytical functions, the optimization procedure is further simplified.

Test results show that the present design method works well and serves as practical tool for the low-rate IRZH code optimization. The present design method can also be extended to general LDPC codes where the single parity-check nodes are replaced by other linear codes, e.g., Hadamard codes or Hamming codes.

The present invention has been shown and described in what are considered to be the most practical and preferred embodiments. That departures may be made there from and that obvious modifications will be implemented by those skilled in the art. It will be appreciated that those skilled in the art will be able to devise numerous arrangements and variations which, although not explicitly shown or described herein, embody the principles of the invention and are within their spirit and scope.

What is claimed is:

1. A for selecting code parameter with minimum signal to noise ratio threshold for a communications code comprising:
   obtaining, using an encoder, extrinsic information transfer (EXIT) information for a repeat-zigzag Hadamard (RZH) code responsive to a Hadamard order and a signal to noise ratio,
   determining code parameters for an irregular repeat zigzag Hadamard (IRZH) code for a corresponding code rate in response to the obtained EXIT values, and repeating the step of obtaining said EXIT information for a different said signal to noise ratio if said corresponding code rate is other than a selected rate.

2. The method of claim 1, wherein said code parameters are a code ensemble for said irregular repeat zigzag Hadamard code.

3. The method of claim 1, wherein said step of obtaining EXIT information comprises obtaining an EXIT curve for repeat-zigzag Hadamard code by Monte Carlo simulation using serial decoding.

4. The method of claim 3, wherein said step of determining code parameters comprises an optimization of maximizing said code rate to determine said code parameters.

5. The method of claim 3, wherein said step of obtaining said EXIT information for a different said signal to noise ratio comprises increasing said signal to noise ratio if said corresponding code rate is less than said target rate.

6. The method of claim 3, wherein said step of obtaining said EXIT information for a different said signal to noise ratio comprises decreasing said signal to noise ratio if said corresponding code rate is greater than said target rate.

7. The method of claim 3, wherein said corresponding code rate is related to a bit error rate.

8. The method of claim 3, wherein a bit error rate is a function of said signal to noise ratio and said corresponding code rate.

9. The method of claim 1, wherein said step of obtaining EXIT information comprises obtaining an EXIT function for parallel decoding of said repeat-zigzag Hadamard code by using equations.

10. The method of claim 9, wherein said step of determining code parameters comprises minimizing a bit error rate BER corresponding to said code rate.

11. The method of claim 9, wherein said step of obtaining said EXIT information for a different said signal to noise ratio comprises decreasing said signal to noise ratio if a bit error rate corresponding to said code rate is less than a target bit error rate.

12. The method of claim 9, wherein said equations include for the information bits $$I_{E,d}^{BIAWGN} \cong 1 - \frac{1}{\ln 2} \sum_{g=0}^{1} \sum_{h=0}^{r} \sum_{j=0}^{m-1} \sum_{k=0}^{1} \left( A_{g,h,j,k}^{d,odd} - A_{g,h,j,k}^{d,even} \right)$$

$$\sum_{i=1}^{\infty} \frac{1}{(2i)(2i-1)} \cdot \Phi_i^g(m_q) \Phi_i^h(m_d) \Phi_i^j(m_p) \Phi_i^k(m_{P_m}),$$

for the connection bits $$I_{E,q}^{BIAWGN} \cong 1 - \frac{1}{\ln 2} \sum_{h=0}^{r} \sum_{j=0}^{m-1} \sum_{k=0}^{1} \left( A_{h,j,k}^{d,odd} - A_{h,j,k}^{d,even} \right)$$

$$\sum_{i=1}^{\infty} \frac{1}{(2i)(2i-1)} \cdot \Phi_i^h(m_d) \Phi_i^j(m_p) \Phi_i^k(m_{P_m}), \text{ and}$$

for the last parity bit $$I_{E,P_m}^{BIAWGN} \cong 1 - \frac{1}{\ln 2} \sum_{g=0}^{1} \sum_{h=0}^{r} \sum_{j=0}^{m} \left( A_{g,h,j}^{P_m,odd} - A_{g,h,j}^{P_m,even} \right)$$

$$\sum_{i=1}^{\infty} \frac{1}{(2i)(2i-1)} \cdot \Phi_i^g(m_q) \Phi_i^h(m_d) \Phi_i^j(m_p).$$

13. The method of claim 1, wherein said step of obtaining EXIT information comprises determining a degree profile that has minimum bit error rate BER by using differential evolution.

14. The method of claim 13, wherein said step of obtaining EXIT information comprises computing said bit error rate during differential evolution optimization by mutual information tracking.

15. A method for selecting code parameter with minimum signal to noise ratio threshold for a communications code comprising:
    choosing a signal to noise ratio,
    selecting a Hadamard code order,
    obtaining, using an encoder, extrinsic information transfer (EXIT) information for one of a serial decoding and a parallel decoding of a irregular repeat-zigzag Hadamard (IRZH) code responsive to said Hadamard order and said signal to noise ratio,
    determining a code ensemble for said irregular repeat zigzag Hadamard (IRZH) code for a related bit error rate in response to the obtained EXIT information, and
    changing the signal to noise ratio for repeated said steps of obtaining said EXIT information and said determining a code ensemble for a different said signal to noise ratio if said related bit error rate is other than a target rate.

16. The method of claim 15, wherein said EXIT information is a curve for said irregular repeat-zigzag Hadamard (IRZH) code obtained by Monte Carlo simulation using said serial decoding.

17. The method of claim 15, wherein said EXIT information is a function for parallel decoding said irregular repeat-zigzag Hadamard (IRZH) code using equations.

* * * * *